(12) United States Patent
Han et al.

(10) Patent No.: US 11,910,731 B2
(45) Date of Patent: Feb. 20, 2024

(54) EMBEDDED HEATER IN A PHASE CHANGE MEMORY MATERIAL

(71) Applicant: International Business Machines Corporation, Armonk, NY (US)

(72) Inventors: Jin Ping Han, Yorktown Heights, NY (US); Philip Joseph Oldiges, Lagrangeville, NY (US); Robert L. Bruce, White Plains, NY (US); Ching-Tzu Chen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 17/172,118

(22) Filed: Feb. 10, 2021

(65) Prior Publication Data
US 2022/0254995 A1    Aug. 11, 2022

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/00* (2023.02); *H10N 70/023* (2023.02); *H10N 70/063* (2023.02); *H10N 70/068* (2023.02); *H10N 70/8413* (2023.02); *H10N 70/8613* (2023.02); *H10N 70/8833* (2023.02)

(58) Field of Classification Search
CPC ...... H01L 45/126; H01L 45/06; H10N 70/231
See application file for complete search history.

(56) References Cited

U.S. PATENT DOCUMENTS

| 7,671,355 B2 | 3/2010 | Kuo |
| 7,835,177 B2 | 11/2010 | Hsu |
| 7,855,378 B2 | 12/2010 | Lin |

(Continued)

FOREIGN PATENT DOCUMENTS

| CN | 101640251 B | 6/2012 |
| CN | 110098325 A | 8/2019 |

(Continued)

OTHER PUBLICATIONS

"Patent Cooperation Treaty PCT Notification of Transmittal of the International Search Report and the Written Opinion of the International Searching Authority, or the Declaration", International application No. PCT/EP2022/051092, International filing date Jan. 19, 2022 (Jan. 19, 2022), dated Jun. 23, 2022 (Jun. 23, 2022), 10 pages.

(Continued)

*Primary Examiner* — Moazzam Hossain
*Assistant Examiner* — Hajar Kolahdouzan
(74) *Attorney, Agent, or Firm* — Edward J. Wixted, III

(57) ABSTRACT

A phase change memory cell for a semiconductor device that includes a heater element on a first conductive layer with a spacer surrounding sides of the heater element. The phase change memory cell includes a first dielectric layer on the conductive layer and on a bottom portion of the spacer surrounding the heater element and a second dielectric layer on the first dielectric layer surrounding a top portion of the heater element. The phase change memory cell includes a phase change material on a top surface of the heater element and on the second dielectric material.

9 Claims, 8 Drawing Sheets

(56) References Cited

U.S. PATENT DOCUMENTS

| | | | |
|---|---|---|---|
| 7,915,602 B2 | 3/2011 | Sato | |
| 9,123,415 B2 | 9/2015 | Liu | |
| 2003/0189200 A1* | 10/2003 | Lee | H10N 70/011 |
| | | | 257/1 |
| 2008/0191187 A1* | 8/2008 | Lung | H10N 70/8833 |
| | | | 438/102 |
| 2008/0272358 A1* | 11/2008 | Lin | H10N 70/8828 |
| | | | 257/E47.001 |
| 2009/0159867 A1* | 6/2009 | Savransky | H10N 70/8828 |
| | | | 438/102 |
| 2009/0236583 A1 | 9/2009 | Kuo | |
| 2010/0163828 A1 | 7/2010 | Tu | |
| 2011/0053335 A1 | 3/2011 | Sasaki | |
| 2011/0065252 A1 | 3/2011 | Nakamura | |
| 2012/0126196 A1* | 5/2012 | Pio | H10N 70/231 |
| | | | 257/E21.003 |
| 2013/0187120 A1 | 7/2013 | Redaelli | |
| 2020/0168792 A1* | 5/2020 | Song | G11C 13/0097 |
| 2020/0287134 A1 | 9/2020 | Ok | |

FOREIGN PATENT DOCUMENTS

| | | |
|---|---|---|
| EP | 1675183 A1 | 6/2006 |
| EP | 1677372 B1 | 5/2008 |

OTHER PUBLICATIONS

Disclosed Anonymously et al., "Phase Change Memory Cell with Plural Nano Heaters", ip.com Prior Art Database Technical Disclosure, IPCOM000263592D, Sep. 15, 2020, pp. 1-16.

Disclosed Anonymously et al., "Method and Structure for Creating a Heater with an Inverse Taper Angle for Phase-Change Memory (PCM) Mushroom Cell", ip.com Prior Art Database Technical Disclosure, IPCOM000260076D, Oct. 18, 2019, pp. 1-6.

Rajendran et al., "On the Dynamic Resistance and Reliability of Phase Change Memory", IEEE 2008 Symposium on VLSI Technology, Honolulu, HI, 2008, pp. 1-2, doi: 10.1109/VLSIT.2008.4588576.

* cited by examiner

Key:
- ............ P = 0nm
- ----- P = 10nm
- -·-·- P = 20nm
- - - - P = 30nm
- ——— P = 40nm

Model Assumptions:
- TiN heater with SiN spacer
- TiN CD = 20nm, SiN = 10nm
- heater CD = 40nm, H = 50nm
- PCM 90 transition temp. approx. 900°K
- P = varying

Model Output:

P = 0nm
$V_{on\ set}$ = 0.86V
$I_{on\ set}$ = 198µA
$P_{on\ set}$ = 170µW

P = 40nm
$V_{on\ set}$ = 0.77V
$I_{on\ set}$ = 183µA
$P_{on\ set}$ = 141µW

EMBEDDED HEATER IN A PHASE CHANGE MEMORY MATERIAL

BACKGROUND OF THE INVENTION

The present invention relates generally to the field of semiconductor device technology and more particularly to an embedded heater in a phase change material in semiconductor chip applications including phase change memory devices.

Phase change materials include various chalcogenide glass materials that can be used in semiconductor device applications, such as phase change random access memory (PCRAM), which may also be known as PRAM, PCM, or PCME device. A PCRAM typically has at least two solid phases, a crystalline state and an amorphous state. The transformation between these two phases can be achieved by changing the temperature of the phase change material. Typically, the transformation of the phase change material (PCM) can be induced by heating through optical pulses or electrical or Joule heating.

The optical and electronic properties can vary significantly between the amorphous and crystalline phases of the PCM. In typical memory applications, switching from the high-resistance or "reset" state, where part or all of the phase change material is amorphous, occurs when a current pulse is applied that heats the amorphous material above the crystallization temperature for a sufficiently long time for the material to crystallize. The switch occurs because the threshold switching effect leads to a drastic and sudden (within nanoseconds) reduction of the resistance of the amorphous phase when a certain threshold field is surpassed, at a given threshold voltage. Switching from the low-resistance or "set" state, where the material is crystalline, is achieved by a high current pulse with a very short trailing edge. In typical PCM semiconductor applications, the current pulse heats the material by Joule heating, melts it, and enables very fast cooling (melt-quenching) such that the PCM material solidifies in the amorphous state.

The phase change material exhibits different electrical characteristics depending on its state. In the amorphous state, the phase change material exhibits a higher resistivity than in the crystalline state. A phase change material, in a semiconductor application, may switch between numerous electrically detectable conditions of varying resistivities within a nanosecond time scale with the input of pico joules of energy. Since a phase change material permits reversible phase transformation in a typical case of a phase change random access memory device, the memory bit status can be distinguished by determining the state of phase change material in the memory bit.

SUMMARY

Embodiments of the present invention provide a phase change memory cell for a semiconductor device. The phase change memory cell includes a heater element on a first conductive layer with a spacer surrounding sides of the heater element. The phase change memory cell includes a first dielectric layer on the conductive layer and on a bottom portion of the spacer surrounding the heater element and a second dielectric layer on the first dielectric layer surrounding a top portion of the heater element. The phase change memory cell includes a phase change material on a top surface of the heater element and on the second dielectric material.

Embodiments of the present invention provide a method of forming the phase change memory cell that includes depositing a layer of a heater material on a bottom electrode and selectively etching the layer of the heater material to form a heater. The method includes depositing a layer of a heater material on a bottom electrode and selectively etching the layer of the heater material to form a heater. The method includes forming a spacer on sides of the heater and depositing a first dielectric material on the bottom electrode, on the spacer, and on a top surface of the heater. The method includes removing a top portion of the first dielectric material from the top surface of the heater, from a top portion of the spacer, and over the bottom electrode and depositing a second dielectric material on the top surface of the heater, on the top portion of the spacer, and on the first dielectric layer. Furthermore, the method includes removing a top portion of the second dielectric material stopping on the top surface of the heater and depositing a phase change material on the top surface of the heater and on the second dielectric material. The method includes depositing a layer of a top electrode material on the phase change material.

BRIEF DESCRIPTION OF THE DRAWINGS

The aspects, features, and advantages of various embodiments of the present invention will be more apparent from the following description taken in conjunction with the accompanying drawings.

DETAILED DESCRIPTION

Figure 1:
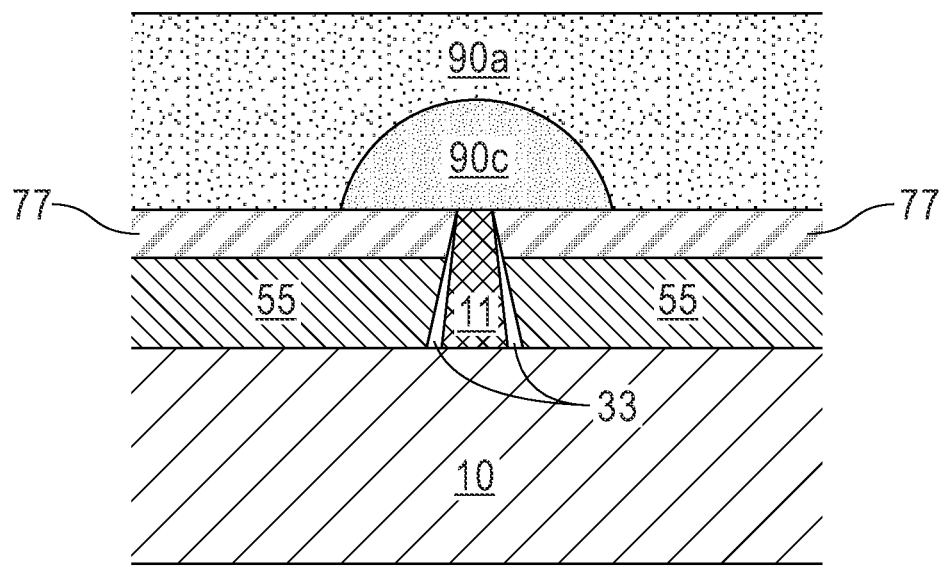
FIG. 1 is a cross-sectional view of an example of a phase change memory cell in a semiconductor structure with a heater element and a PCM material after transforming a mushroom shaped portion of the PCM to a crystalline state in accordance with an embodiment of the present invention.

Embodiments of the present invention recognize that a heater element of a phase change memory cell in a semiconductor device utilizing phase change materials (PCM) is an important element for both memory device applications and well as for applications in analog computing. The heater element provides an ability to effectively switch the PCM from an amorphous state with high resistivity to an electrically conductive crystalline state when a phase transition temperature, such as, the melting point of the PCM is attained. Embodiments of the present invention recognize that in an analog synapse application, the analog state and the dynamic range depend on the heater element to affect changes in the PCM for efficient semiconductor device function. Embodiments of the present invention recognize that a need to improve the rate of heating and cooling of the heater element and the PCM would be needed to improve analog synapse device and memory application device functionality.

Embodiments of the present invention recognize that an ability of a heater element to more quickly and more efficiently provide a thermal energy transfer to the PCM for a faster state change in the PCM is desirable. Embodiments of the present invention recognize that an ability to quickly create a PCM phase transition in a mushroom-shaped portion of the PCM using improved heater element structures and materials would provide improved functionality to semiconductor devices, and in particular, for analog device dynamic range improvements for use in deep neural networks. Embodiments of the present invention recognize that conventional methods of heater formation include filling a small hole in a dielectric material with the heater material that is typically deposited by atomic layer deposition or chemical vapor deposition into the small hole to form the heater. The conventional method of hole formation creates a uniform diameter heater or a tapered heater with a larger top heater diameter where the PCM to heater contact occurs and a smaller bottom heater diameter at the bottom electrode.

Embodiments of the present invention provide a method to form a heater element with a smaller top contact area with the PCM where the heater is embedded or not embedded in the PCM. Embodiments of the present invention provide a heater embedded in a dielectric material that is under the PCM. The dielectric material has a thermal conductivity similar to or matching the thermal conductivity of the PCM. Embodiments of the present invention provide an ability to taper the heater to provide a smaller top surface contacting the PCM and a larger bottom surface contacting the bottom electrode. A heater structure providing a tapered heater with smaller diameter top surface allows the use of well-developed metal gate-first semiconductor manufacturing processes to form the heater. The heater with a smaller top surface eases the use of a plasma vapor deposition of the PCM. The methods to form the tapered heater with a smaller diameter top surface also provide an ability to tune the semiconductor device resistance by varying the embedded heater height, shape, size and spacer thickness according to material selection and semiconductor application needs.

Embodiments of the present invention provide an ability to heat-up and quench the mushroom-shaped phase transition area of the PCM more efficiently and uniformly. Providing a layer of a dielectric material surrounding all but the small top surface of the heater creates a smaller phase transition region for the PCM melt and quench, thus enabling more efficient and faster initiation of phase changes in the PCM using less power to initiate the phase transitions in the PCM.

Additionally, embodiments of the present invention provide an ability to embed the tapered heater into a portion of the PCM material. Thermal modelling of the tapered embedded heater illustrates a reduction in the level of power needed to initiate the phase transition in the PCM. The thermal modelling shows that the power needed to initiate a phase change in the PCM decreases with an increase in the depth of the heater penetration into the PCM material.

Detailed embodiments of the claimed structures and methods are disclosed herein. The method described below does not form a complete process flow for manufacturing integrated circuits, such as, semiconductor devices. The present embodiments can be practiced in conjunction with the integrated circuit fabrication techniques currently used in the art, for semiconductor devices, and only so much of the commonly practiced process steps are included as are necessary for an understanding of the described embodiments. The figures represent cross-section portions of a heater element embedded in a PCM material in a semiconductor device, such as a memory device or an analog device. The figures are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of an example of a phase change memory cell in a semiconductor structure with heater 11 in accordance with an embodiment of the present invention. As depicted, FIG. 1 includes bottom electrode 10, heater 11, spacer 33, dielectric layer 55, low k dielectric material 77 with a thermal conductivity approximately matching the thermal conductivity of the PCM material in PCM 90a and PCM 90c. In some embodiments, low k dielectric material 77 is a material approximately matching the thermal conductivity of PCM 90a and 90c that is not a low k dielectric material. FIG. 1 illustrates an example of the PCM material (i.e., PCM 90a and PCM 90c) after transforming a mushroom shaped portion of the PCM material with an amorphous state depicted as PCM 90a to PCM 90c with a crystalline state. For example, PCM 90a is in an amorphous state or structure of the PCM that can be transformed to PCM 90c with a crystalline state when heater 11 provides sufficient energy for heating PCM 90a to a phase transformation temperature. The phase transformation temperature, in this case, a melting point of the PCM, creates a change in the PCM material atomic structure from PCM 90a to PCM 90c or from PCM 90c to PCM 90a, in other examples (not depicted in FIG. 1). As depicted in FIG. 1, heater 11 encapsulated by spacer 33 can be embedded in a layer of dielectric material 77. In various embodiments, dielectric material 77 is a material, such as a low k dielectric material, selected with a thermal conductivity matching or approximately matching the thermal conductivity of the PCM material (e.g., depicted as PCM 90a and PCM 90c in FIG. 1). In other embodiments, heater 11 is embedded in the PCM material when dielectric material 77 is not present.

The modified cone-shape of heater 11 in FIG. 1 can be formed using negative-tone patterning. The sides of heater 11 can be vertical or tapered as is the case for the modified cone-shape of heater 11 in FIG. 1. The sides of tapered heater 11 form an angle greater than 90 degrees with the surface of bottom electrode 10. The tapered sides of heater 11 provide a smaller top diameter for heater 11 than the diameter in the bottom portion of heater 11. Using the modified cone-shape or tapered heater 11 covered by spacer 33 provides better heat transfer to PCM 90a by heater 11 (e.g., heater 11 has less heat loss).

Figure 2:
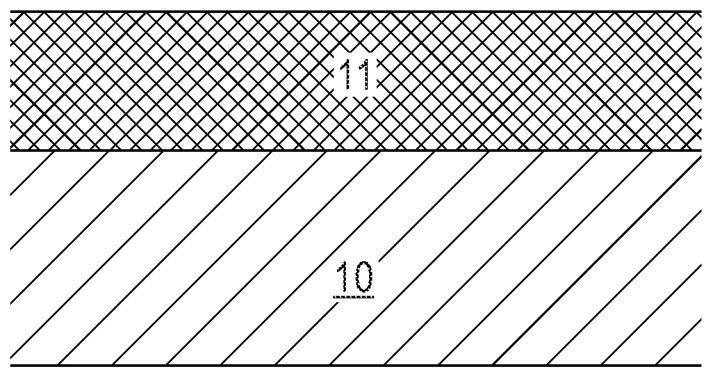
FIG. 2 is a cross-sectional view of a phase change memory cell in a semiconductor structure after depositing a layer of heater material over a conductive layer in accordance with an embodiment of the present invention.

FIG. 2 is a cross-sectional view of a semiconductor structure to form a phase change memory cell after depositing a layer of material for heater 11 over bottom electrode 10 in accordance with an embodiment of the present invention. The semiconductor structure on FIG. 1 includes a layer of material from heater 11 over bottom electrode 10. Bottom electrode 10 may be composed of tungsten (W), Copper (Cu), any conductive material, metal or metal alloy used for electrodes in a semiconductor device. In some embodiments, bottom electrode 10 is a portion of a conductive layer of a semiconductor device and may be a line, a via pad, a contact, or other conductive feature of the semiconductor structure. Using a semiconductor deposition process, such as, plasma vapor deposition (PVD), chemical vapor deposition (CVD), spin-on process (spin-on glass), or other suitable deposition process, a layer of heater material is deposited on bottom electrode 10. The heater 11 may be composed of titanium nitride (TiN), titanium tungsten (TiW), a multilayer heater material (e.g., tantalum nitride/titanium nitride), doped Si, doped silicon germanium (SiGe), or other material commonly used in heater elements in a PCRAM or other phase change memory cell in another type semiconductor device. The thickness of the layer of material for heater 11 can range from 50 to 80 nm but, is not limited to these thicknesses.

Figure 3:
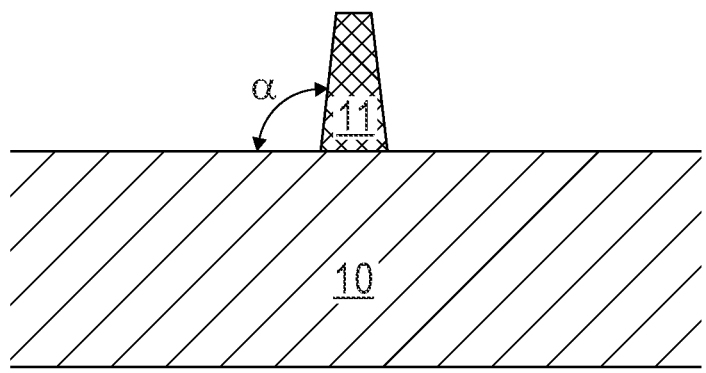
FIG. 3 is a cross-sectional view of the semiconductor structure after forming a heater element in accordance with an embodiment of the present invention.

FIG. 3 is a cross-sectional view of the semiconductor structure after forming heater 11 in accordance with an embodiment of the present invention. The layer of material may be etched to form heater 11. One of wet chemical etch process (e.g., using photolithography patterning) or a dry etch process may be used to etch heater 1. For example, the etch process to form a smaller diameter heater 11, can be a dry etch process, such as, a reactive ion etch (RIE). When a larger diameter is formed in heater 11, a wet chemical etch may be used. The etch process may be a double patterning etch process for forming a very small diameter in heater 11. For example, a small heater bottom diameter of 15 to 30 nm may use a double patterning etch process, such as, a double patterning RIE. In one embodiment, an extreme ultra-violet etch process is used to form heater 11 with a very small diameter. The bottom diameter of heater 11 after etching may range from 15-50 nm but, is not limited to these diameters. The diameter of heater 11 may vary according to the height of heater 11, the PCM, and the desired thermal and electrical properties of heater 11 in the completed semiconductor chip application.

Heater 11 may have a tapered shape with a wider bottom, such as, cone shape, a modified cone-shape with a flat top, a triangular (e.g., prism) shape, or a tapered rectangular column shape. For example, a flat top surface of heater 11 may be 20 nm wide and a bottom portion of heater 11 may be 30 nm wide. In an embodiment, a width of the bottom portion of heater 11 is greater than 100 nm. In various embodiments, heater 11 is etched in one of a cone shape, a modified cone shape with a flat top, a round or rectangular column shape, an oval shape, or a triangular shape. Heater 11 can also have a uniform diameter or a column shape (e.g., a round, oval, rectangular, or triangular column).

Heater 11 is depicted with angle α between the sides of heater 11 and a top surface of bottom electrode 10 which is parallel to the top surface of the semiconductor substrate (not depicted). In various embodiments, angle α is 90 degrees or greater. For example, angle α may be 90 to 120 degrees but, is not limited to these angles. As depicted, angle α is greater than 90 degrees.

Using a tapered shape heater 11 where angle α is greater than 90 degrees can provide improvements to energy transfer to the PCM material deposited in later steps. For example, thermal modelling of a completed phase change memory cell similar to FIG. 1 without dielectric material 77 estimates that a significant reduction of the power needed to initiate a phase change in the PCM occurs with a tapered heater 11 as opposed to a column shaped non-tapered heater with a uniform diameter heater (e.g., a heater with vertical sides). The thermal modelling identified that the $P_{onset}$ needed for a phase transition in the PCM with a tapered heater 11 was approximately 25% lower than the power ($P_{onset}$) required to initiate the phase change in the PCM with a non-tapered heater with vertical sides and a uniform diameter.

Using a tapered heater 11 forming a 95 degree angle with bottom electrode 10 that was embedded 30 nm in the PCM, the thermal model determined that an estimated current needed (i.e., $I_{onset}$) to initiate a phase change temperature in PCM 90a is approximately 106 uA. The thermal model determined that a voltage needed (i.e., $V_{onset}$) to initiate the phase change in PCM 90a material is approximately 0.95 V with the tapered heater 11 and that the power needed (i.e., $P_{onset}$) to initiate the phase change in PCM 90a to PCM 90c is approximately 100.7 uW. The thermal modelling of the non-tapered heater embedded 30 nm in the PCM resulted in a $P_{onset}$ of 133.5 uW as compared to the $P_{onset}$ of 100.7 uW with a tapered heater 11. For the non-tapered heater, an estimated $I_{onset}$ was 178 uA and an estimated $V_{onset}$ was 0.75 uW according to the thermal modelling.

The assumptions used in the thermal model included that heater 11 was composed of TiN with a ten nanometer thick layer of silicon nitride (SiN) as the spacer. Heater 11 was assumed to be embedded thirty nanometers in the PCM material (not depicted in FIG. 4). The PCM material as depicted in FIG. 1 was GST where GST is germanium-antimony-tellurium or $Ge_xSb_yTe_z$ where x, y, and z represent a number of atoms) that is doped with one or more of O, N, H, $SiO_2$, SiN, Ti, $Ti_xO_y$. The sides of tapered heater 11 formed a 95 degree with the horizontal surface (e.g., bottom electrode 10). Tapered heater 11 had a modified-cone shape with a flat top. The non-tapered heater with a uniform diameter heater and vertical sides (no taper) were assumed to use the same materials.

Figure 4:
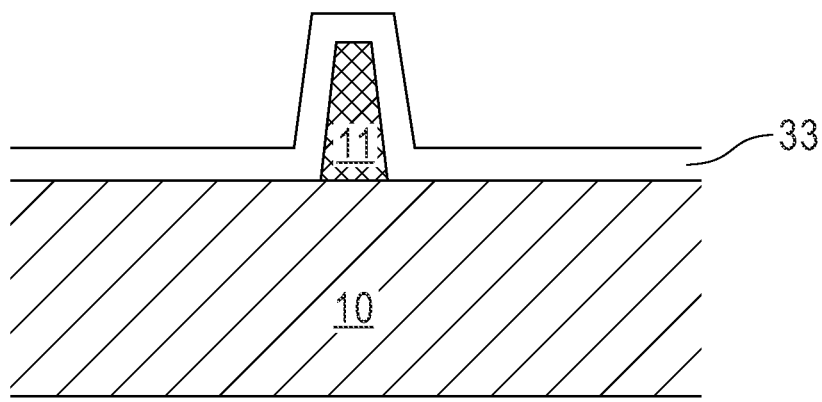
FIG. 4 is a cross-sectional view of the semiconductor structure after depositing a layer of a dielectric material over the semiconductor structure in accordance with an embodiment of the present invention.

FIG. 4 is a cross-sectional view of the semiconductor structure after depositing spacer 33 over the semiconductor structure in accordance with an embodiment of the present invention. Spacer 33 can be deposited as a layer of a dielectric material suitable for forming a spacer. In various embodiments, the dielectric material for spacer 33 has a low thermal conductivity and high thermal boundary resistance (G) with respect to the PCM material. For example, spacer 33 is composed of a SiN compound ($SiN_x$) such as SiN, a silicon oxide compound ($SiO_x$) such as silicon dioxide ($SiO_2$), a nitride material, a hafnium oxide ($HfO_x$) material such as $HfO_2$), or an $Al_2O_3/O_2$ multilayer material. In various embodiments, SiN is deposited on heater 11 and bottom electrode 10 for spacer 33. A thickness of spacer 33 for forming a spacer around heater 11 may range from 5-50 nm, but, is not limited to this range.

Figure 5:
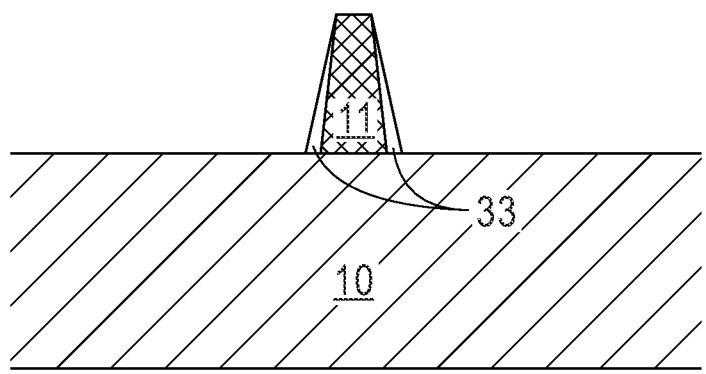
FIG. 5 is a cross-sectional view of the semiconductor structure after etching a portion of the layer of the dielectric material to form a spacer in accordance with an embodiment of the present invention.

FIG. 5 is a cross-sectional view of the semiconductor structure after etching a portion of the dielectric material for spacer 33 in accordance with an embodiment of the present invention. Using known spacer formation processes, an etch removes portions of spacer 33 from horizontal surfaces of bottom electrode 10 and heater 11. For example, a RIE etch may be used to remove portions of spacer 33 from the horizontal surfaces of heater 11 and bottom electrode 10 while leaving a portion of spacer 33 on the sides of heater 11 to form a spacer. Spacer 33 may have a triangular or rounded triangle shape typical of a spacer (e.g., for a gate, etc.). In some cases, spacer 33 may have a top width in the range of 5 to 25 nm and a bottom width in the range of 10 to 50 nm. Spacer 33 surrounding heater 11 preserves power efficiency for heater 11 by using a low thermally conductive material for spacer 33. In some cases, spacer 33 may have a generally uniform thickness from the top to the bottom of spacer 33. In other cases, spacer 33 may have a thicker bottom area and a thinner top area associated with a top surface of heater 11. Semiconductor processes developed for advanced metal gate-first metallization and spacer formation may be utilized to create spacer 33 and heater 11.

Figure 6:
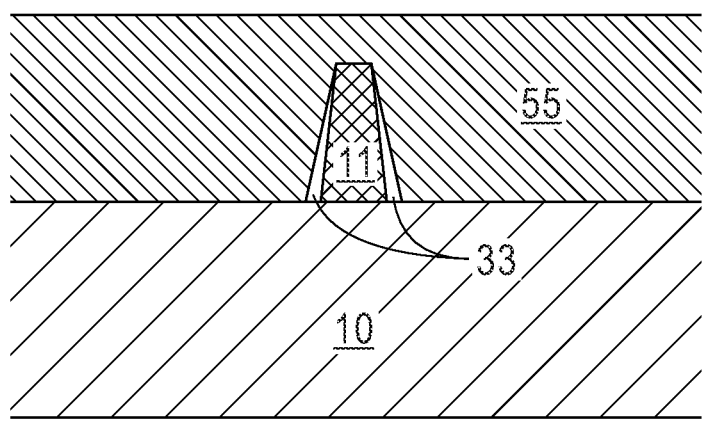
FIG. 6 is a cross-sectional view of the semiconductor structure after depositing a second dielectric layer in accordance with an embodiment of the present invention.

FIG. 6 is a cross-sectional view of the semiconductor structure after depositing dielectric layer 55 in accordance with an embodiment of the present invention. In various embodiments, dielectric layer 55 is deposited over exposed surfaces of bottom electrode 10, spacer 33, and heater 11. Dielectric layer 55 may be composed of a second, different dielectric material than the dielectric material used in spacer 33. For example, dielectric layer 55 may be composed of $SiO_2$ when spacer 33 is another dielectric material such as SiN. In some cases, dielectric layer 55 and spacer 33 are composed of the same dielectric material.

Figure 7:
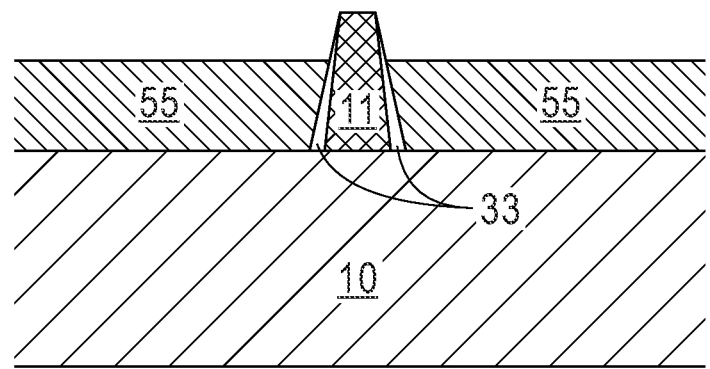
FIG. 7 is a cross-sectional view of the semiconductor structure after a chemical mechanical polish (CMP) and an etch of a top portion of the second dielectric material in accordance with an embodiment of the present invention.

FIG. 7 is a cross-sectional view of the semiconductor structure after a CMP and an etch of a top portion of dielectric layer 55 in accordance with an embodiment of the present invention. A CMP removes the top surface of dielectric layer 55 using the top surface of heater 11 as a CMP stop. The CMP removes dielectric layer 55 above the top surface of dielectric layer 55.

After the CMP, a selective over-etch process, which may be a wet or dry etch process, removes a top portion of dielectric layer 55 around heater 11. For example, for removing more of dielectric layer 55 when dielectric layer 55 is thicker, a wet subtractive etch using photolithograph may be used to selectively remove portions of dielectric layer 55 over bottom electrode 10, spacer 33, and heater 11 while spacer 33 and heater 11 remains. A bottom portion of dielectric layer 55 remains around heater 11 and on the top surface of bottom electrode 10. The thickness of the remaining portion of dielectric layer 55 may vary depending on the height of heater 11 and a desired thickness of the next layer of a material deposited on the semiconductor structure. For example, the thickness of the remaining dielectric layer 55 above bottom electrode 10 may be half of the height of heater 11 to about ninety percent of the height of heater 11.

Figure 8:
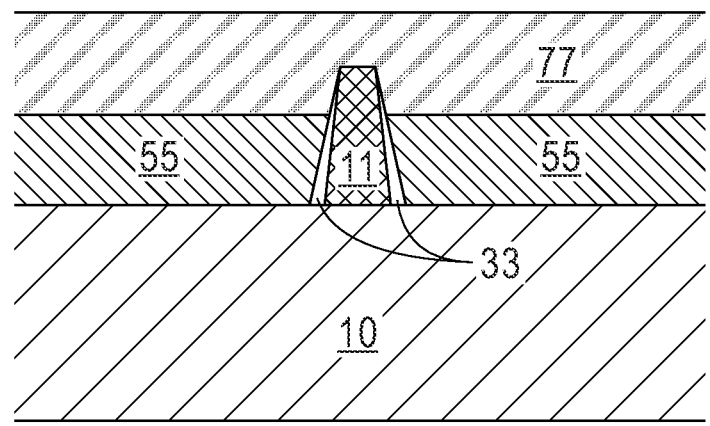
FIG. 8 is a cross-sectional view of the semiconductor structure after depositing a layer of a third dielectric material with a similar thermal conductivity as a PCM material in accordance with an embodiment of the present invention.

FIG. 8 is a cross-sectional view of the semiconductor structure after depositing a layer of low k dielectric material 77 with a similar thermal conductivity as a PCM material in accordance with an embodiment of the present invention. A deposition process, such as, PVD, CVD, a spin-on process, or the like, may be used to deposit a layer of a material with a thermal conductivity matching or approximately matching the thermal conductivity of the PCM material deposited later in one of the following steps.

In various embodiments, the deposited material in this step is a low k dielectric material with a thermal conductivity approximately the same as the thermal conductivity of the PCM that will be used in the semiconductor structure in one of the following deposition processes. For example, low k dielectric material 77 may be 100-500 nm. The specific low k dielectric material selected for low k dielectric material 77 can be tailored to match the selection of a material for the PCM and is not limited to a low k dielectric material. In other embodiments, the deposited material is not a low k dielectric material but, another material with a thermal conductivity that matches or approximately matches the PCM thermal conductivity. A typical thickness of low k dielectric material 77 can be in the range of 100-200 nm, but, is not limited to this range.

Figure 10:
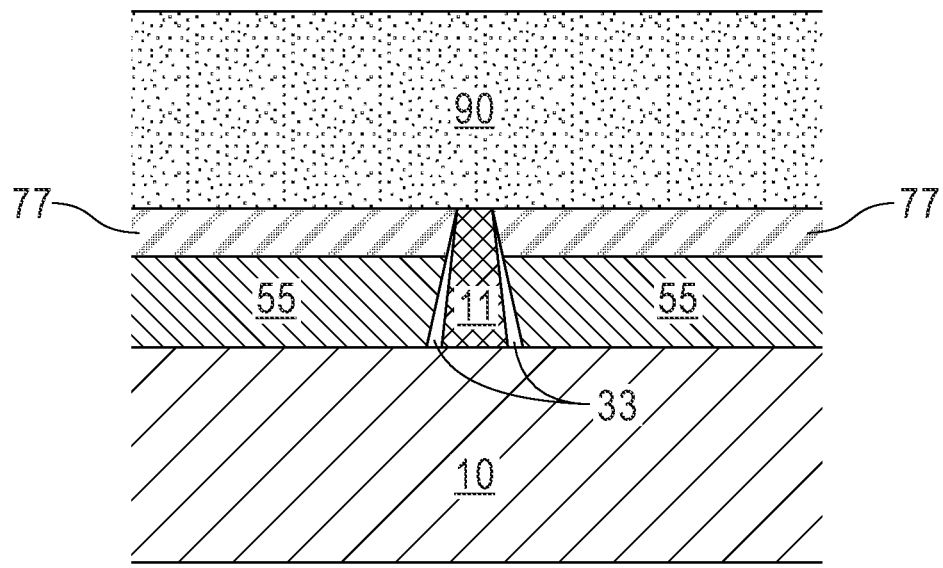
FIG. 10 is a cross-sectional view of the semiconductor structure after depositing a layer of a PCM material over the semiconductor structure in accordance with an embodiment of the present invention.

The layer of low k dielectric material 77 with a thermal conductivity close to the thermal conductivity of selected PCM material deposited later as depicted in FIG. 10 reduces the energy or power needed to initiate a phase change in the melt/quench region of the PCM as discussed later in detail with respect to FIG. 11.

Figure 9:
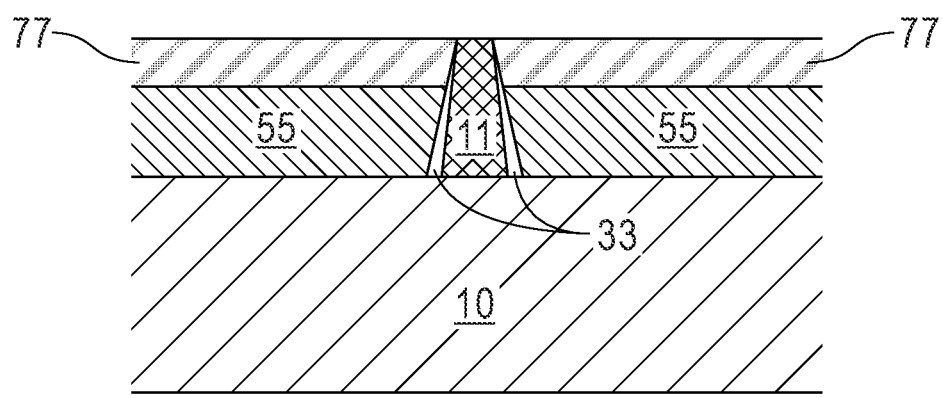
FIG. 9 is a cross-sectional view of the semiconductor structure after performing a CMP in accordance with an embodiment of the present invention.

FIG. 9 is a cross-sectional view of the semiconductor structure after performing a CMP in accordance with an embodiment of the present invention. The top portion of low k dielectric material 77 can be removed using a CMP stopping on the top surface of heater 11. The thickness of low k dielectric material 77 remaining may vary depending on the thickness of dielectric layer 55 after etching and the height of heater 11. For example, the thickness of low k dielectric material 77 can be half or less than half of the heater height when the selected PCM is GST (i.e., germanium (Ge), antimony (Sb), tellurium (Te) as GST). In various embodiments, the total thickness of low k dielectric material 77 and dielectric layer 55 will equal to heater 11 height (i.e., the top surface of heater 11 is level with the top surface of low k dielectric material 77). In one embodiment, the height of heater 11 is slightly greater than the top surface of low k dielectric material 77 (e.g., a top portion of heater 11 with spacer 112 extends into PCM 90). After CMP, a top surface of heater 11 is level with or the same height as the top surface of low k dielectric material 77. The addition of a layer of low k dielectric material 77 in the completed phase change memory cell can provide a reduction in the amount of energy or power required to initiate a phase transformation in the PCM.

FIG. 10 is a cross-sectional view of the semiconductor structure after depositing of a layer of PCM 90 over the semiconductor structure in accordance with an embodiment of the present invention. A layer of PCM 90 may be deposited over the exposed surfaces of low k dielectric material 77, spacer 33 (if exposed), and heater 11. Deposition of PCM 90 occurs with known PCM material deposition processes (e.g., PVD, CVD, spin-on processes, etc.), and thickness of PCM 90 deposition ranges from 80 to 300 nm but, is not limited to these thicknesses. PCM 90 may be any known PCM material. In various embodiments, PCM 90 is a chalcogenide or chalcogenide glass material. For example, PCM 90 can be a doped or undoped GST, such as, $Ge_2 Sb_2 Te_5$. In various embodiments, PCM 90 is GST. GST in PCM 90 may be undoped or doped with one or more of O, N, H, $SiO_2$, SiN, Ti, $Ti_xO_y$, for example. In other embodiments, PCM 90 may be a reverse phase change material such as $Cr_2Ge_2Te_6$. PCM 90 may be deposited with a large range of thicknesses. For example, PCM 90 may be deposited between 80 to 300 nm but, is not limited to these thicknesses.

Figure 11:
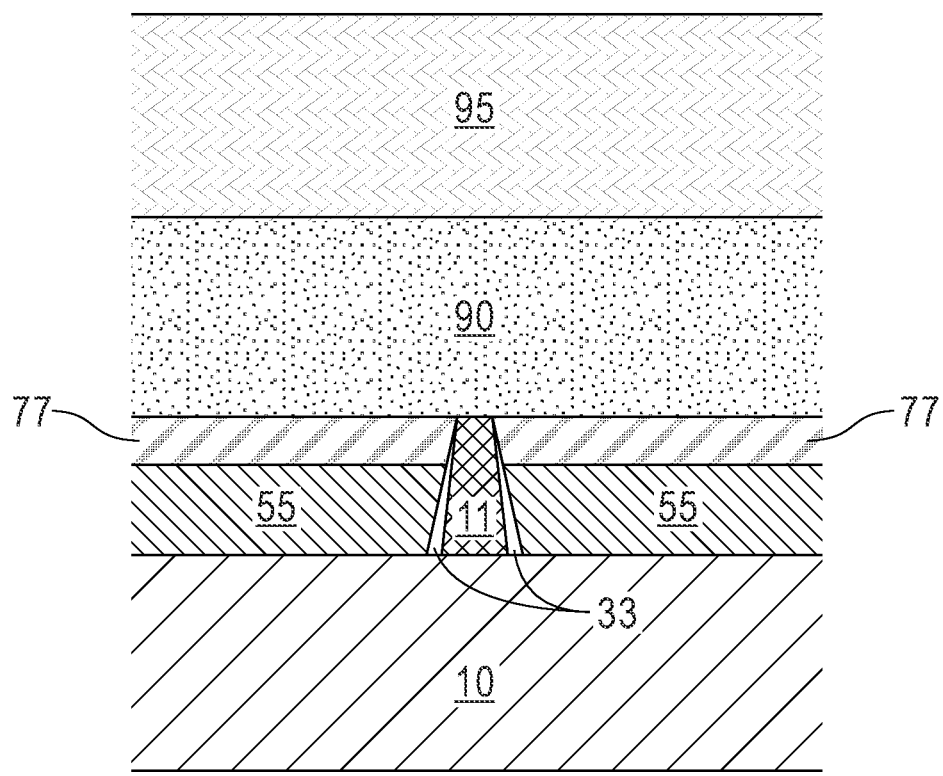
FIG. 11 is a cross-sectional view of the phase change memory cell in the semiconductor structure after depositing a layer of a conductive material over the semiconductor structure in accordance with an embodiment of the present invention.

FIG. 11 is a cross-sectional view of the phase change memory cell in the semiconductor structure after depositing a layer of a conductive material over the semiconductor structure in accordance with an embodiment of the present invention. As depicted, FIG. 11 includes bottom electrode 10, dielectric layer 55, spacer 33 on heater 11, PCM 90, and top electrode 95. The conductive material, such as, Al, W, Cu, or other known conductive material for semiconductor electrodes or interconnections, can be deposited over PCM 90 to form top electrode 95.

Thermal modelling of the semiconductor structure of FIG. 11 with and without the layer of low k dielectric material 77 determined that about a 10% reduction in the power needed to initiate a phase transformation in PCM 90 (e.g., $P_{onset}$) occurs when the layer of low k dielectric material 77 is present below PCM 90. The thermal model determined when the layer of low k dielectric material 77 is present around a top portion of the embedded heater 11, a reduction in the power ($P_{onset}$) to initiate a phase transition occurs compared to the power ($P_{onset}$) needed to initiate the phase transformation in the same semiconductor structure without the layer of low k dielectric material 77.

The thermal model evaluated the power needed to transform PCM 90 to and from an amorphous state to a crystalline state when heater 11 is embedded to a depth of 30 nm in low k dielectric material 77 and evaluated that a higher power onset, ($P_{onset}$) was needed to transform PCM 90 with a similar semiconductor structure without the layer of low k dielectric material 77 under PCM 90.

The thermal model determined that less power is required to initiate phase changes in PCM 90 when the layer of low k dielectric material 77 is present as depicted in FIG. 11. The layer of low k dielectric material 77 reduces the melt/quench region occurring during PCM 90 phase transformation. For example, a melt/quench region of PCM 90 phase change can be depicted as the mushroom shaped region of PCM 90*c* in FIG. 1.

When heater 11 is embedded 30 nm in PCM 90, the melt/quench region is larger than when low k dielectric material 77 is present. When low k dielectric material 77 is not present and heater 11 is embedded 30 nm in PCM 90, the larger melt/quench region can extend around the sides of embedded heater 11 below the top surface of heater 11 as well as above the top surface of heater 11 especially with increasing time at the transition or melt temperature. The melt/quench region of PCM 90 is larger without low k dielectric material 77 and therefore, requires more power to initiate PCM 90 phase changes.

The thermal model assumes an inversely tapered heater forming a 95 degree angle with horizontal surfaces (95 degree angle of the exterior side of heater 11 with bottom electrode 10) and a flat top ((e.g., a modified cone wider at the bottom) and a dielectric material surrounding top electrode 95 and PCM 90, which was a GST material. Low k dielectric material 77 in the model was assumed to be 30-40 nm thick and heater 11 was TiN with SiN forming spacer 33.

For example, the thermal model resulted in $P_{onset}$ of 93 uW with low k dielectric material 77 but, without low k dielectric material 77 the $P_{onset}$ was estimated as 101 uW.

The processes used to form the semiconductor structure of FIG. 11 include advanced metal gate-first metallization and spacer formation processes and techniques. The processes discussed for forming heater 11 can provide a heater top shape including a circle, an oval, a square, a rectangle, or a triangle. Additionally, the semiconductor structure of FIG. 11 can provide heater 11 which can be embedded in PCM 90 or in another material (e.g., low k dielectric material 77) selected with a thermal conductivity that matches the thermal conductivity of PCM 90. As known to one skilled in the art, the semiconductor structure depicted in FIG. 11, can be further processed using known semiconductor manufacturing processes and integrated, in some cases, into a memory semiconductor chip, such as a PCRAM, into an analog synapse in a semiconductor chip utilized in a deep neural network or another semiconductor device application.

Figure 12:
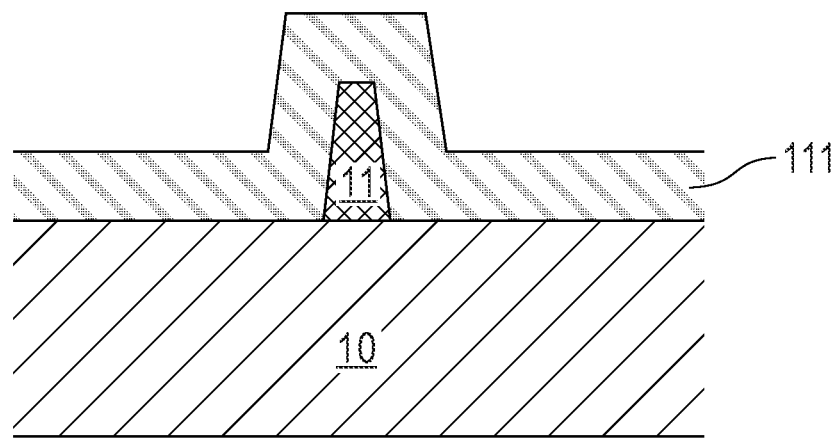
FIG. 12 is a cross-sectional view of a semiconductor structure after depositing a first dielectric material over a heater element in accordance with a second embodiment of the present invention.

FIG. 12 is a cross-sectional view of a semiconductor structure to form a phase change memory cell after depositing dielectric material 111 over heater 11 in accordance with a second embodiment of the present invention. As depicted, FIG. 12 includes heater 11 and bottom electrode 10 that are essentially the same as heater 11 and bottom electrode 10 as described with respect to FIG. 3 and dielectric material 111 deposited over heater 11 and bottom electrode 10. For example, the thickness of dielectric material 111 ranges between 20 and 100 nm. In various embodiments, dielectric material 111 is SiN. Dielectric material 111 is not limited to SiN and may be another dielectric material such as SiON, $Al_2O_3$, $HfO_2$, HfSiO, HfSiON, $ZrO_x$.

Figure 13:
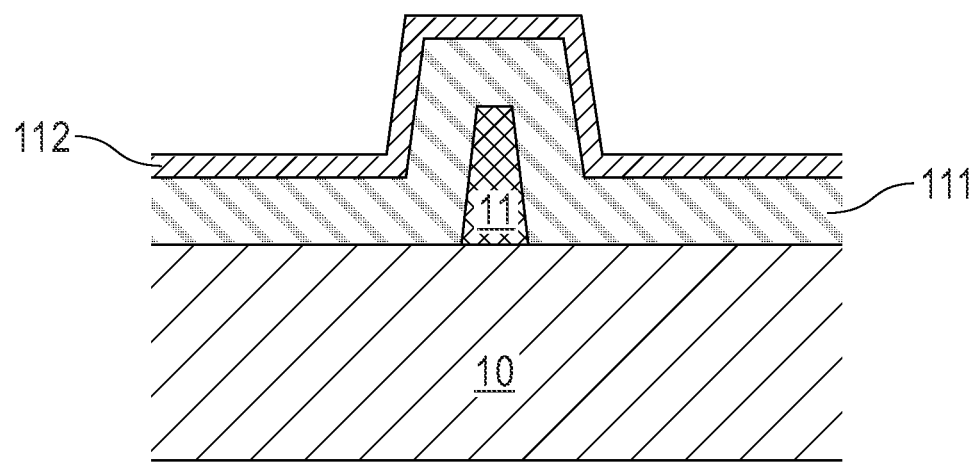
FIG. 13 is a cross-sectional view of the semiconductor structure after depositing a layer of a second dielectric material in accordance with the second embodiment of the present invention.

FIG. 13 is a cross-sectional view of the semiconductor structure after depositing a layer of dielectric material for spacer 112 in accordance with the second embodiment of the present invention. Using known processes for spacer formation, the deposited layer of dielectric material for spacer 112 can be composed of a different dielectric material than dielectric material 111. In order to selectively remove a portion of the dielectric material to form spacer 112 as depicted later in FIG. 14, the material used in the layer of dielectric material selected for spacer 12 has a higher level of selectivity during RIE or a higher etch rate during RIE (e.g., spacer 112 is more easily removed during RIE than dielectric material 111). For example, spacer 112 is composed of $SiO_2$ when dielectric material 111 is composed of SiN.

The thickness of the layer of dielectric material for spacer 112 is less than the thickness of the layer of dielectric material 111. For example, a thickness of spacer 112 may be less than one half the thickness of dielectric material 111. The thickness of spacer 112 is less than the thickness of dielectric material because as depicted later in FIG. 14, a thin layer of dielectric material for spacer 112 can be more easily removed from horizontal surfaces of dielectric material 111 during an etch process, such as RIE, without removing a significant portion of dielectric material 111.

Figure 14:
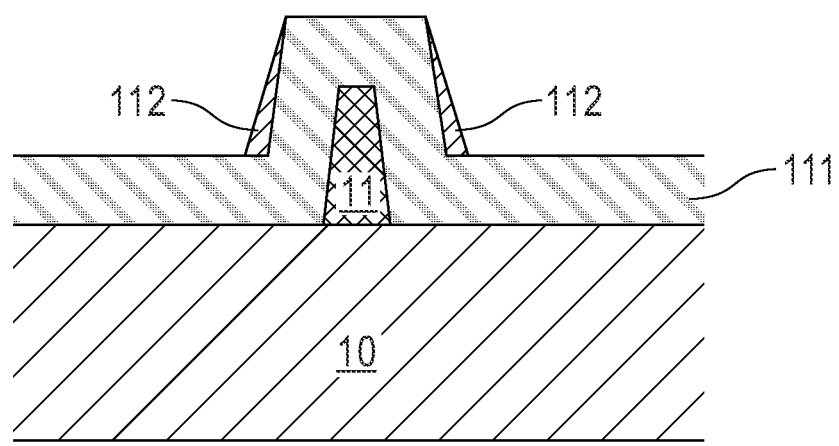
FIG. 14 is a cross-sectional view of the semiconductor structure after forming a spacer from a portion of the second dielectric material on the sides of the heater in accordance with the second embodiment of the present invention.

FIG. 14 is a cross-sectional view of the semiconductor structure after forming spacer 112 on the sides of the heater in accordance with the second embodiment of the present invention. Using known semiconductor spacer formation processes, an etch process, such as RIE, removes a portion of spacer 112 from horizontal surfaces of the semiconductor structure. After etching, a portion of spacer 112 remains surrounding the sides of heater 11. The remaining portion of spacer 112 on the vertical or near vertical sides of heater 11 form a spacer around heater 11.

Figure 15:
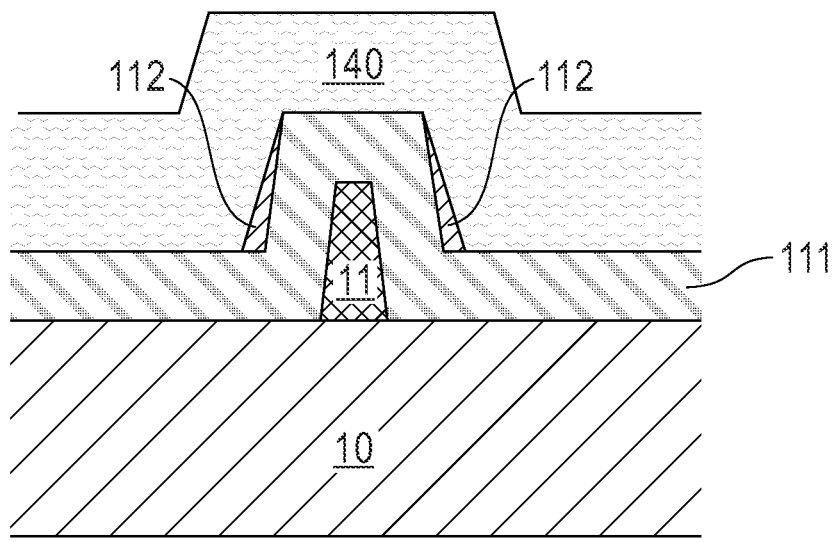
FIG. 15 is a cross-sectional view of the semiconductor structure after depositing a sacrificial material on the semiconductor structure in accordance with the second embodiment of the present invention.

FIG. 15 is a cross-sectional view of the semiconductor structure after depositing sacrificial material 140 on the semiconductor structure in accordance with the second embodiment of the present invention. As depicted in FIG. 15, a layer of sacrificial material 140 can be deposited over exposed surfaces of dielectric material 111 and spacer 112. Sacrificial material 140 can be a soft material, such as an amorphous carbon. For example, sacrificial material 140 has a lower material hardness than the material forming heater 11 and the material selected for dielectric material 111.

Figure 16:
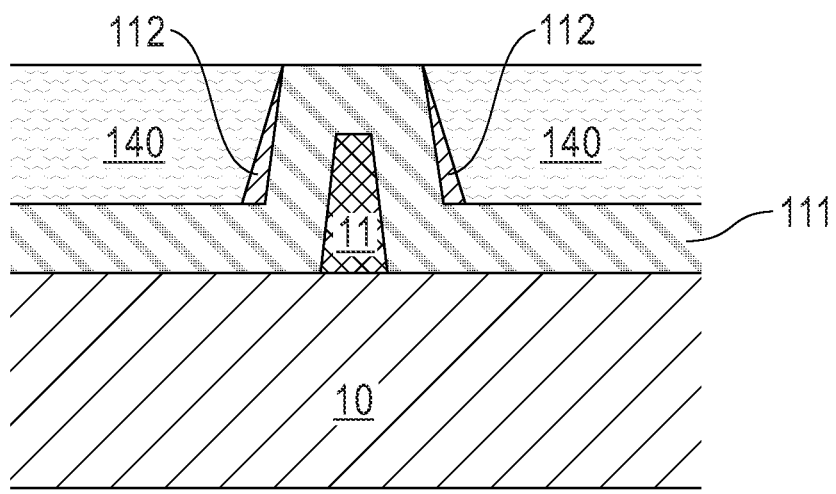
FIG. 16 is a cross-sectional view of the semiconductor structure after a CMP stopping at the top surface of the second dielectric material in accordance with the second embodiment of the present invention.

FIG. 16 is a cross-sectional view of a semiconductor structure after a CMP stopping at the top surface of dielectric material 111 in accordance with the second embodiment of the present invention. The first CMP removes the top portion of sacrificial material 140 over dielectric material 111 and spacer 112. The CMP stops on the top surface of dielectric material 111 that is over the top of heater 11. The portions of sacrificial material 140 remaining reside on spacer 112 and on the horizontal surface of dielectric material 111 that resides directly on bottom electrode 10. For example, the CMP halts removal sacrificial material 140 upon contacting dielectric material 111 above the top portion of heater 11.

Figure 17:
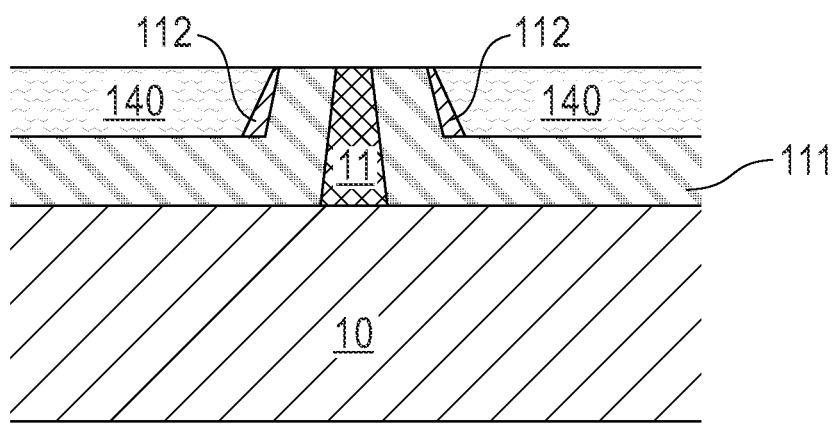
FIG. 17 is a cross-sectional view of the semiconductor structure after a CMP stopping at the top surface of the heater in accordance with the second embodiment of the present invention.

FIG. 17 is a cross-sectional view of a semiconductor structure after a CMP stopping at the top surface of heater 11 in accordance with the second embodiment of the present invention. The second CMP stops at the top surface of heater 11. The second CMP removes the portion of sacrificial material 140 above the level of the top surface of heater 11, removes the portion of spacer 112 above the level of the top surface of heater 11, and removes the portion of dielectric material 111 above the level of the top surface of heater 11. A portion of sacrificial material 140 over dielectric material 111 and spacer 112 remains.

Figure 18:
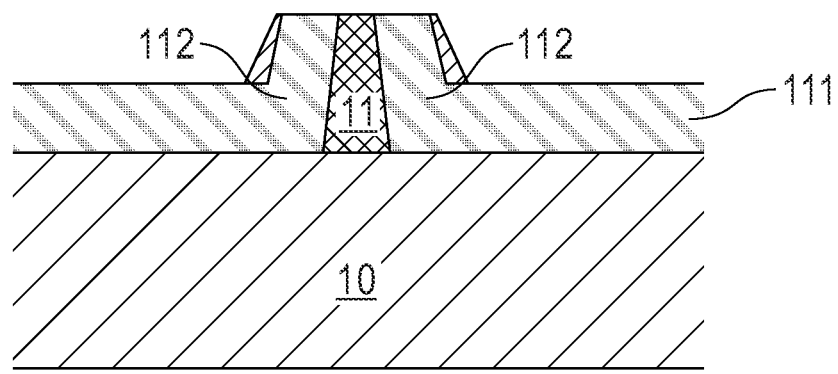
FIG. 18 is a cross-sectional view of a semiconductor structure after removing the sacrificial material in accordance with the second embodiment of the present invention.

FIG. 18 is a cross-sectional view of a semiconductor structure after removing sacrificial material 140 in accordance with the second embodiment of the present invention. A wet chemical etch process using photolithography or a dry etch process (e.g., RIE) can selectively remove the remaining portion of sacrificial material 140 from dielectric material 111 and spacer 112. In one embodiment, the etch process removes spacer 112 (e.g., an optional spacer removal not depicted in FIG. 18).

Figure 19:
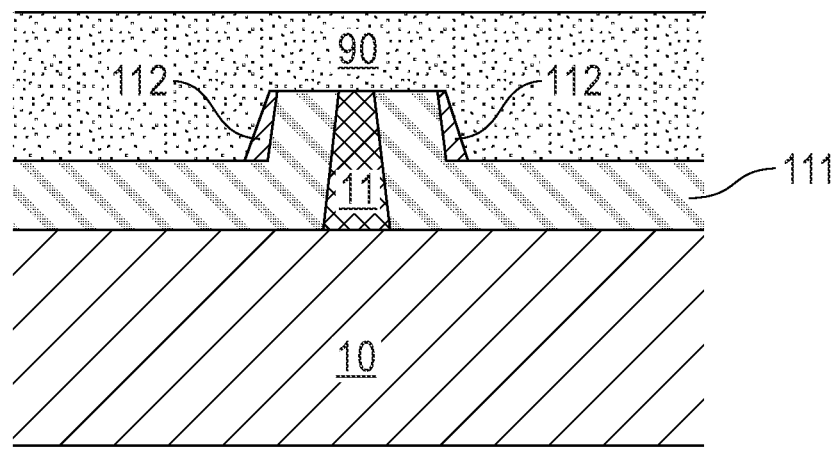
FIG. 19 is a cross-sectional view of the semiconductor structure after depositing a layer of a PCM material in accordance with the second embodiment of the present invention.

FIG. 19 is a cross-sectional view of a semiconductor structure after depositing a layer of PCM 90 in accordance with the second embodiment of the present invention. A layer of PCM 90 is deposited on exposed surfaces of dielectric material 111, spacer 112, and heater 11. The thickness of PCM 90 may vary depending on the height of heater 11. For example, the thickness of PCM 90 may range between 15 and 50 nm but, is not limited to these thicknesses. As discussed in reference to FIG. 2, PCM 90 can be any PCM material. For example, PCM 90 is a doped or undoped GST material. PCM 90 is essentially the same material as PCM 90 in FIG. 2. In various embodiments, the top surface of heater 11 extends at least 5 nanometers above the top surface of PCM 90. In an embodiment, the top surface of heater 11 is the same height as the top surface of PCM 90 (i.e., the top surface of heater 11 can be level with the top surface of PCM 90).

Figure 20:
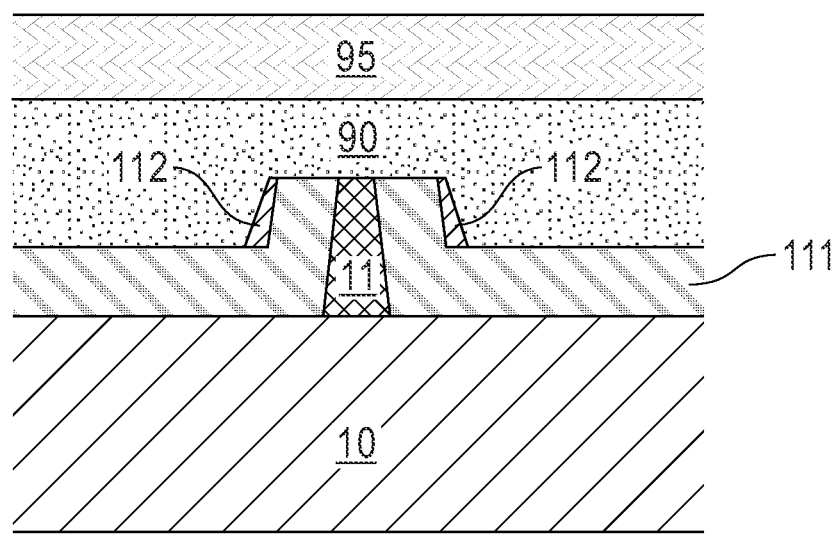
FIG. 20 is a cross-sectional view of the semiconductor structure after depositing a layer of a conductive material on the semiconductor structure in accordance with the second embodiment of the present invention.

FIG. 20 is a cross-sectional view of the semiconductor structure of the phase change memory cell after depositing a layer of a conductive material for top electrode 95 on the semiconductor structure in accordance with the second embodiment of the present invention. The conductive material in top electrode 95 may be any conductive material used in semiconductor devices. For example, top electrode 95 may be Al, W, Cu, or another conductive material, metal, or suitable metal alloy used in semiconductor device electrodes or contacts. The thickness of top electrode 95 can vary.

As known to one skilled in the art, a patterning and a deposition of a dielectric material or ILD around top electrode 95 and/or other layers of the of the phase change memory cell depicted in FIG. 20 may occur according to typical semiconductor manufacturing processes to complete the semiconductor chip or PCRAM memory device.

The difference between the height of heater 11 above bottom electrode 10 and the thickness of dielectric material 111 can determine the depth heater 11 is embedded in PCM 90. Embedding heater 11, as depicted in FIG. 20, in PCM 90 can improve performance of the semiconductor device using PCM 90.

Figure 21:
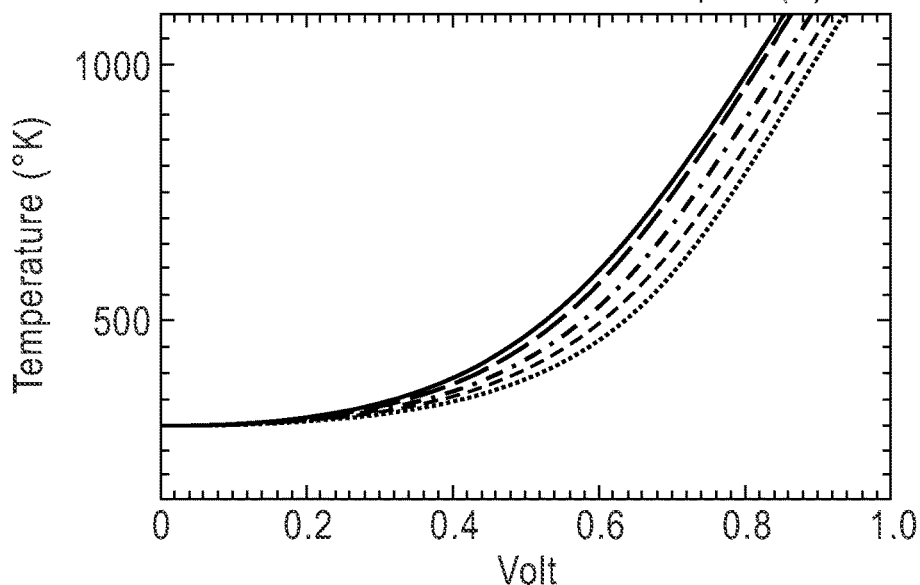
FIG. 21 depicts an example of the results of a thermal analysis of the effect of voltage versus temperature for various embedded heater depths in accordance with an embodiment of the present invention.
Figure 21:
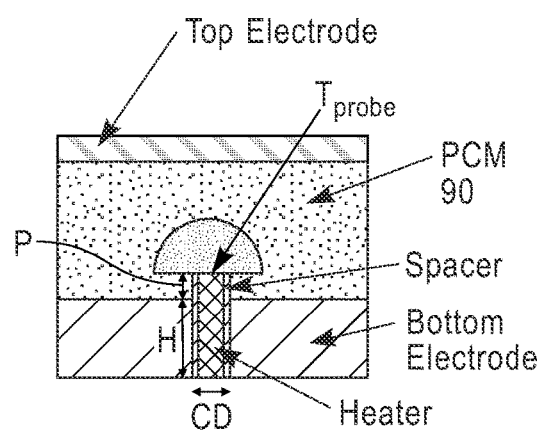

FIG. 21 depicts an example of the results of a thermal analysis of the effect of voltage in volts versus temperature in degrees Kelvin for various embedded heater depths in accordance with an embodiment of the present invention. The graph illustrates the resulting PCM 90 temperate in a probe adjacent to a top surface of the heater. The model assumes a tapered heater with the heater sides forming a 95 degree angle with the top surface of the bottom. The thermal model uses different depths, p, of the heater in PCM 90.

FIG. 21 shows the expected variation of temperature in the probe for various applied voltages for four embedding depths of the heater in PCM 90. A melting point for a phase transition in a GST material used for PCM 90 is about 600 degrees Celsius or about 873 degrees Kelvin.

The graph of temperature versus voltage for various embedded heater depths (P) provides a line for each depth, p=40 nm, p=30 nm, p=20 nm, p=10 nm, and p=0 nm (not embedded) of the heater extending into PCM 90. An example of the thermal model outputs, such as $V_{onset}$, $I_{onset}$, and $P_{onset}$ associated with the graphs of temperature vs voltage for the four different depths of the heater embedded in the PCM are depicted in as Model Output in FIG. 21. $V_{onset}$, $I_{onset}$, and $P_{onset}$ are a voltage, a current, and a power, respectively, associated with a temperature initiating a phase change in PCM 90).

According to the thermal model and graph of temperature vs voltage depicted in FIG. 21, the initiation of a phase change in PCM 90 can occur with approximately 25% less power when the heater is embedded 40 nm into the PCM than when the heater is not embedded in the PCM. As depicted in FIG. 21, a $P_{onset}$ required to achieve a phase transition temperature was determined to be 141 uW when p=40 nm (i.e., when the heater protruded or was embedded 40 nm in PCM 90). Correspondingly, the model determined a $P_{onset}$ to achieve the phase transition in PCM 90 when p=0 nm, (i.e., the heater is not embedded) was 170 uW.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory cell comprising:
   a cone-shaped heater element on a first conductive layer, wherein the cone-shaped heater element is composed of a solid cone of a heater material;
   a dielectric material completely surrounding angled sides of the cone-shaped heater element with a spacer on angled sides of the dielectric material; and
   a phase change material over a top surface of the cone-shaped heater element, over the top surface and sides of the spacer on the angled sides of the dielectric material, and over a portion of a top surface of the dielectric material.

2. The phase change memory cell of claim 1, wherein the cone-shaped heater element has a flat top.

3. The phase change memory cell of claim 2, wherein the top surface of the spacer contacts the phase change material.

4. The phase change memory cell of claim 1, wherein a portion of the cone-shaped heater element, the dielectric material on the side of the heater element, and the spacer surrounding the dielectric material extend into a portion of the phase change material.

5. The phase change memory cell of claim 1, wherein the dielectric material and the spacer material are different materials with a different reactive ion etch selectivity.

6. The phase change memory cell of claim 1, wherein the dielectric material is composed of silicon nitride surrounding the spacer composed of silicon dioxide when the phase change material is a doped germanium-antimony-tellurium material.

7. The phase change memory cell of claim 1, wherein the phase change material is composed of $Cr_2Ge_2Te_6$, and wherein $Cr_2Ge_2Te_6$ is reverse phase change material with a higher resistivity in a crystalline phase than in an amorphous phase.

8. The phase change memory cell of claim 1, wherein the spacer has a thickness that is less than one half the thickness of the dielectric material that is under the spacer.

9. The phase change memory cell of claim 1, wherein the cone-shaped heater element is composed of the heater material selected from the group consisting of titanium nitride (TiN), titanium tungsten (TiW), a multilayer heater material (e.g., tantalum nitride/titanium nitride), doped Si, doped silicon germanium (SiGe), and chromium-germanium-tellurium ($Cr_2Ge_2Te_6$).

* * * * *